US011414776B2

(12) United States Patent
Lin et al.

(10) Patent No.: US 11,414,776 B2
(45) Date of Patent: Aug. 16, 2022

(54) ELECTROCHEMICAL PROCESSING DEVICE AND METHOD FOR OPERATING ELECTROCHEMICAL PROCESSING DEVICE

(71) Applicant: Industrial Technology Research Institute, Hsinchu (TW)

(72) Inventors: Shih-Ming Lin, Chiayi County (TW); Ming-Huei Yen, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 739 days.

(21) Appl. No.: 16/411,589

(22) Filed: May 14, 2019

(65) Prior Publication Data

US 2020/0181794 A1 Jun. 11, 2020

(30) Foreign Application Priority Data

Dec. 10, 2018 (TW) .................................. 107144277

(51) Int. Cl.
*H01L 21/00* (2006.01)
*C25F 3/12* (2006.01)
(Continued)

(52) U.S. Cl.
CPC .................. *C25F 3/12* (2013.01); *C25F 7/00* (2013.01); *H01L 21/32134* (2013.01);
(Continued)

(58) Field of Classification Search
CPC ......... H01L 21/67086; H01L 21/32134; H01L 21/67253; H01L 22/20; H01L 22/14;
(Continued)

(56) References Cited

U.S. PATENT DOCUMENTS

| 5,337,015 A | 8/1994 | Lusting et al. |
| 5,838,447 A | 11/1998 | Hiyama et al. |

(Continued)

FOREIGN PATENT DOCUMENTS

| CN | 101336471 B | 12/2008 |
| TW | 200505628 | 2/2005 |

(Continued)

OTHER PUBLICATIONS

Taiwan Patent Office, Notice of Allowance, Patent Applicaiton Serial No. 107144277, dated Jun. 27, 2019, Taiwan.

*Primary Examiner* — Nikolay K Yushin

(57) ABSTRACT

An electrochemical processing device includes a current supply unit, a jig, and a controller. The current supply unit provides current for an electrochemical process. The jig includes a clamping region for clamping a substrate, a plurality of processing electrodes disposed in the clamping region and connected to the current supply unit, and a plurality of measuring electrodes disposed in the clamping region. The controller is connected to the plurality of measuring electrodes. When the jig clamps the substrate to perform the electrochemical process, the controller provides a measuring current to the measuring electrode to measure the thickness of the metal layer of the substrate.

11 Claims, 7 Drawing Sheets

(51) Int. Cl.
*H01L 21/67* (2006.01)
*C25F 7/00* (2006.01)
*H01L 21/3213* (2006.01)
*H01L 21/66* (2006.01)

(52) U.S. Cl.
CPC .. *H01L 21/67086* (2013.01); *H01L 21/67253* (2013.01); *H01L 22/20* (2013.01)

(58) Field of Classification Search
CPC . H01L 22/12; H01L 22/26; C25F 3/12; C25F 3/16; C25F 3/00; C25F 7/00
See application file for complete search history.

(56) References Cited

U.S. PATENT DOCUMENTS

| | | | |
|---|---|---|---|
| 6,670,200 B2 | 12/2003 | Ushio et al. | |
| 6,923,710 B2 | 8/2005 | Han | |
| 7,052,920 B2 | 5/2006 | Ushio et al. | |
| 9,555,517 B2 | 1/2017 | Takahashi et al. | |
| 10,985,006 B2 * | 4/2021 | Shoji | C25D 17/004 |
| 2006/0028872 A1 | 2/2006 | Rolandi et al. | |
| 2007/0210382 A1 | 9/2007 | Yoshino et al. | |
| 2013/0210172 A1 | 8/2013 | Chen et al. | |
| 2019/0295836 A1 * | 9/2019 | Shoji | H01L 21/67253 |

FOREIGN PATENT DOCUMENTS

| | | |
|---|---|---|
| TW | 200600618 A | 1/2006 |
| TW | I554654 | 10/2016 |
| TW | I570280 | 2/2017 |

* cited by examiner

ELECTROCHEMICAL PROCESSING DEVICE AND METHOD FOR OPERATING ELECTROCHEMICAL PROCESSING DEVICE

CROSS REFERENCE TO RELATED APPLICATION

This Application claims priority of Taiwan Patent Application No. 107144277, filed on Dec. 10, 2018, the entirety of which is incorporated by reference herein.

TECHNICAL FIELD

The present disclosure relates to an electrochemical processing device.

BACKGROUND

In conventional semiconductor processes, after various semiconductor processes (e.g., a copper electroplating process) are performed to fill metal into vias of a substrate, a chemical mechanical polishing (CMP) process or an etching process is performed to remove excess metal or thin the metal. However, if the substrate is a flexible substrate or an ultra-thin glass, the substrate may be easily deflected and broken when the chemical mechanical polishing process is performed.

Therefore, the substrate is etched using an etching process (e.g., an electrolytic etching process) to avoid deflection or breakage of the substrate. Compared to chemical mechanical polishing process, etching process typically does not have devices that measure the thickness of the metal layer on-line. Since the thickness of the metal layer can not be measured on-line during the etching process, an etching stop layer (e.g., a nickel (Ni) layer) is normally formed on the substrate in order to prevent over-etching during the etching process, which can damage the metal filled into the vias of the substrate. However, the additional formation of the etching stop layer on the substrate also increases the complexity and cost of the semiconductor processes. Therefore, a device capable of simultaneously performing the etching process and measuring the thickness of the metal layer is needed.

SUMMARY

The present disclosure provides an electrochemical processing device. The electrochemical processing device includes a current supply unit used to provide a current for performing an electrochemical process, a jig, and a controller. The jig includes a clamping region used to clamp a substrate, a plurality of processing electrodes disposed in the clamping region and connected to the current supply unit, and a plurality of measuring electrodes disposed in the clamping region. The controller is connected to the plurality of measuring electrodes. When the jig clamps the substrate to perform the electrochemical process, the controller provides a measuring current to the measuring electrode to measure the thickness of the metal layer of the substrate.

The present disclosure provides a method for operating an electrochemical processing device. The method includes clamping a substrate in the clamping region of a jig to perform an electrochemical process; and providing a measuring current to a plurality of measuring electrodes in the clamping region by a controller to measure the thickness of the metal layer of the substrate when performing the electrochemical process.

BRIEF DESCRIPTION OF DRAWINGS

In order to describe the manner in which the above-recited features of the disclosure can be obtained, a more particular description of the principles briefly described above will be rendered by reference to specific examples thereof which are illustrated in the appended drawings. It should be understood that these drawings depict only exemplary aspects of the disclosure and are therefore not to be considered to be limiting of its scope. The principles herein are described and explained with additional specificity and detail through the use of the accompanying drawings, in which.

DETAILED DESCRIPTION

Figure 1:
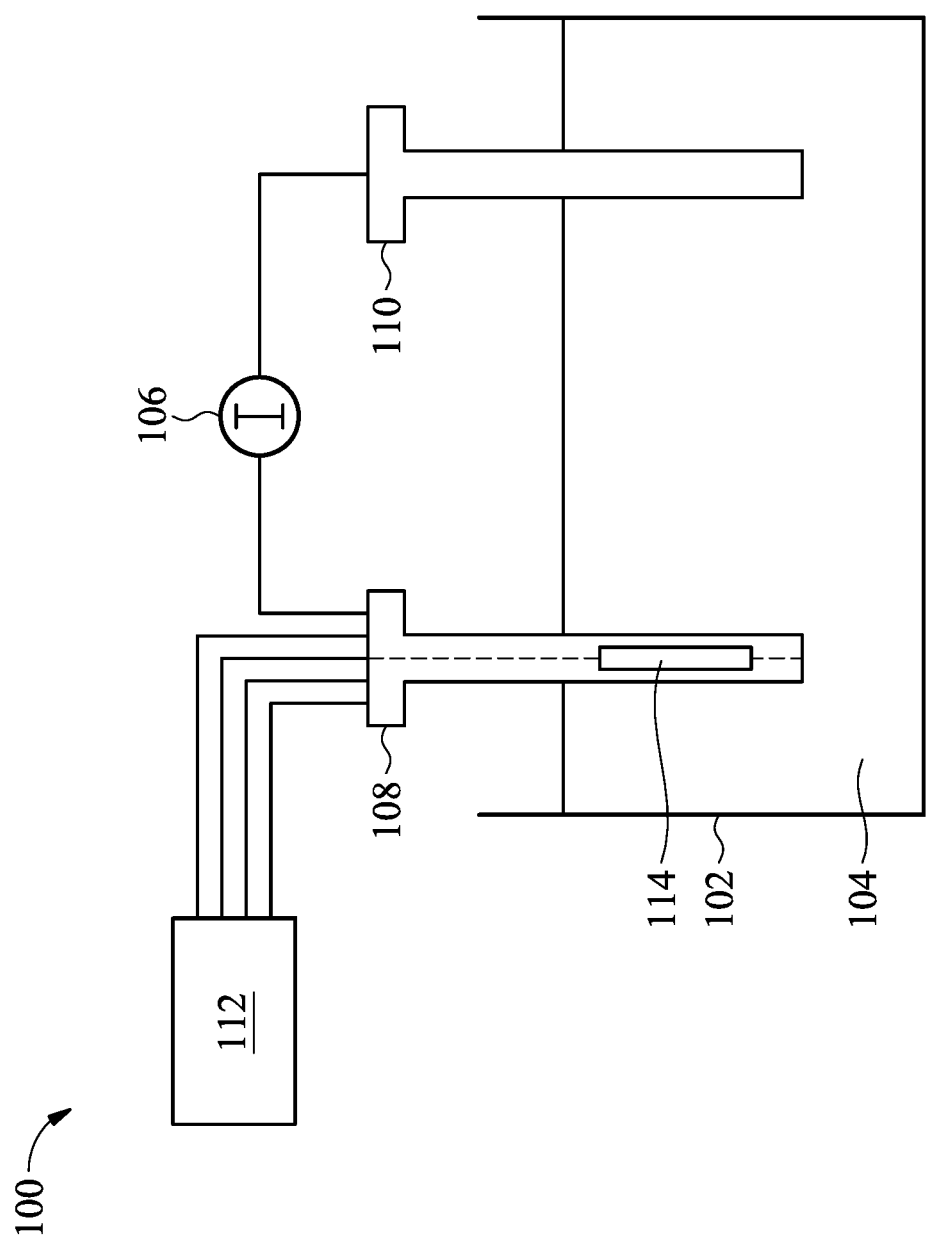
FIG. 1 illustrates an electrochemical processing device, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates an electrochemical processing device, in accordance with some embodiments of the present disclosure. The electrochemical processing device 100 includes a tank 102, an electrolyte solution 104, a current supply unit 106, a jig 108, a metal electrode 110, a controller 112, and a substrate 114. The electrochemical processing device 100 may perform an electrochemical process on the substrate 114, such as an electroplating process or an electrolytic etching process (also referred to as an electropolishing process).

As shown in FIG. 1, the electrolyte solution 104 is placed in the tank 102, the jig 108 and the metal electrode 110 are immersed in the electrolyte solution 104, wherein the substrate 114 clamped by the jig 108 is completely below the liquid level of the electrolyte solution 104. The electrolyte solution 104 is a solution having an electrolyte which changes depending on the metal to be electroplated or electrolyzed. Specifically, the metal ions of the electrolyte in the electrolyte solution 104 is the same as the metal material to be electroplated or electrolyzed. For example, if the electrochemical processing device 100 performs copper (Cu) electroplating or copper electrolysis, the electrolyte in the electrolyte solution 104 is copper-containing solution, such as copper sulfate (CuSO4) or copper cyanide (CuCN). For another example, if the electrochemical processing device 100 performs nickel (Ni) electroplating or nickel electrolysis, the electrolyte in the electrolyte solution 104 is ammonium nickel sulfate ($(NH_4)_2Ni(SO_4)_2 \cdot 6H_2O$).

The current supply unit 106 is connected to processing electrodes (not shown) in the jig 108 and the metal electrode 110 to provide a current to perform the electrochemical process. Specifically, when the electrochemical processing device 100 performs the electroplating process, the current supply unit 106 provide a current to the metal electrode 110 (i.e., provides electrons to the processing electrodes in the jig 108), so that a redox reaction can occur on the substrate to electroplate the metal. When the electrochemical processing device 100 performs an electrolytic etching process, the current supply unit 106 provides a current to the processing electrodes in the jig 108 (i.e., provides electrons to the metal electrode 110), so that the metal on the substrate can undergo a redox reaction to electrolytically etch the metal. In the present embodiment, the current supply unit 106 is a direct current power source (i.e., provides a direct current). In other embodiments, the current supply unit 106 provides a current with pulse profile.

The metal electrode 110 is the same as the metal material to be electroplated or electrolyzed for the substrate 114. For example, if the electrochemical processing device 100 performs copper (Cu) electroplating or copper electrolysis, the metal material of the metal electrode 110 is copper. For another example, if the electrochemical processing device 100 performs nickel (Ni) electroplating or nickel electrolysis, the metal material of the metal electrode 110 is nickel. Therefore, the metal ions of the electrolyte in the electrolyte solution 104 are the same as the metal material of the metal electrode 110.

When the electrochemical processing device 100 performs the electrochemical process, the controller 112 may measure the thickness of the metal thin film (or metal layer) on the substrate 114 on-line to determine whether the electrochemical process has been completed. Specifically, the controller 112 is connected to measuring electrodes (not shown) in the jig 108 and uses the measuring electrodes to measure the thickness of the metal layer on the substrate 114 by using a measuring current. In the present embodiment, the measuring current is an alternating current to prevent the measuring current from affecting the electrochemical process. A detailed measurement of the thickness of the metal layer will be discussed later.

The jig 108 is used to clamp the substrate 114 and is immersed in the electrolyte solution 104 to perform the electrochemical process. As discussed above, the jig 108 includes the processing electrodes (not shown) connected to the current supply unit 106 and the measuring electrodes (not shown) connected to the controller 112. The detailed structure of the jig 108 will be discussed later.

Figure 2A:
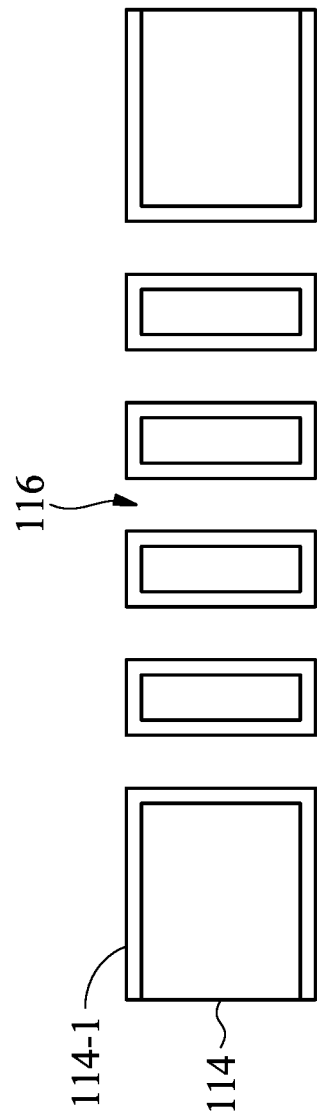
FIGS. 2A and 2B illustrate a substrate, in accordance with some embodiments of the present disclosure.
Figure 2B:
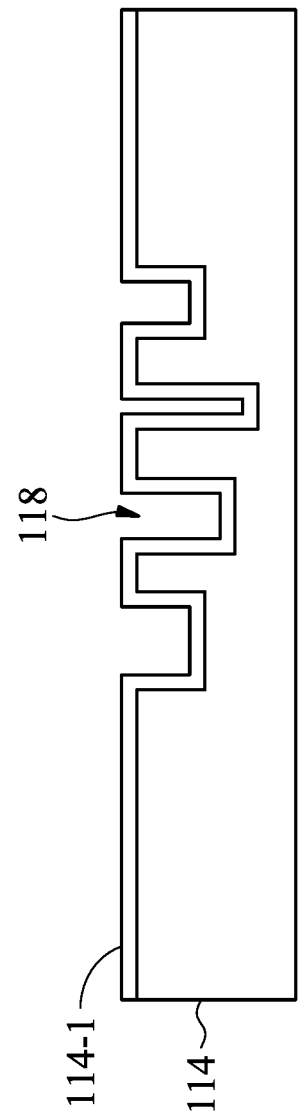

The substrate 114 has vias (e.g., a plurality of vias 116 in FIG. 2A), holes or trenches (e.g., a plurality of holes or trenches 118 in FIG. 2B). In some embodiments, a metal seed layer 114-1 is first formed on the substrate 114 (as shown in FIGS. 2A and 2B) to facilitate the implementation of the electroplating process before the electroplating process is performed to fill the vias, holes or trenches of the substrate 114. In some embodiments, after the metal layer is formed to fill the vias, holes, or trenches in the substrate 114 through various semiconductor processes (e.g., sputtering, physical vapor deposition (PVD), or electroplating), the formed metal layer is normally thick and the surface of the metal layer is rough and uneven. An electrolytic etching process is performed to remove excess metal layers or to thin the metal. The subsequent term "metal layer" may include a seed layer before performing the electroplating process or a metal layer used to fill vias before performing the electrolytic etching process. The substrate 114 may be a flexible substrate or an ultra-thin glass, wherein the flexible substrate may include a polymer material, a ceramic material or other suitable material.

As discussed above, the electrochemical processing device 100 may perform the electrochemical process. The electrolyte in the electrolyte solution 104 dissociates the metal ions, and the electrochemical process can be performed by the metal ions, the redox reaction of the metal layer on the substrate 114 and the redox reaction of the metal electrode 110. For example, if the electrochemical processing device 100 performs a copper electroplating process, a reduction reaction of copper occurs in the metal layer on the substrate 114:

$$Cu^{2+} + 2e^- \rightarrow Cu$$

and an oxidation reaction occurs in the metal electrode 110:

$$Cu \rightarrow Cu^{2+} + 2e^-$$

In this case, the metal layer on the substrate 114 is also referred to as the cathode in the electroplating process, and the metal electrode 110 is also referred to as the anode in the electroplating process.

In contrast, if the electrochemical processing device 100 performs a copper electrolytic etching process, an oxidation reaction of copper occurs in the metal layer on the substrate 114:

$$Cu \rightarrow Cu^{2+} + 2e^-$$

and a reduction reaction occurs in the metal electrode 110:

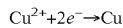

In this case, the metal layer on the substrate 114 is also referred to as the anode in the electroplating process, and the metal electrode 110 is also referred to as the cathode in the electroplating process.

Figure 3:
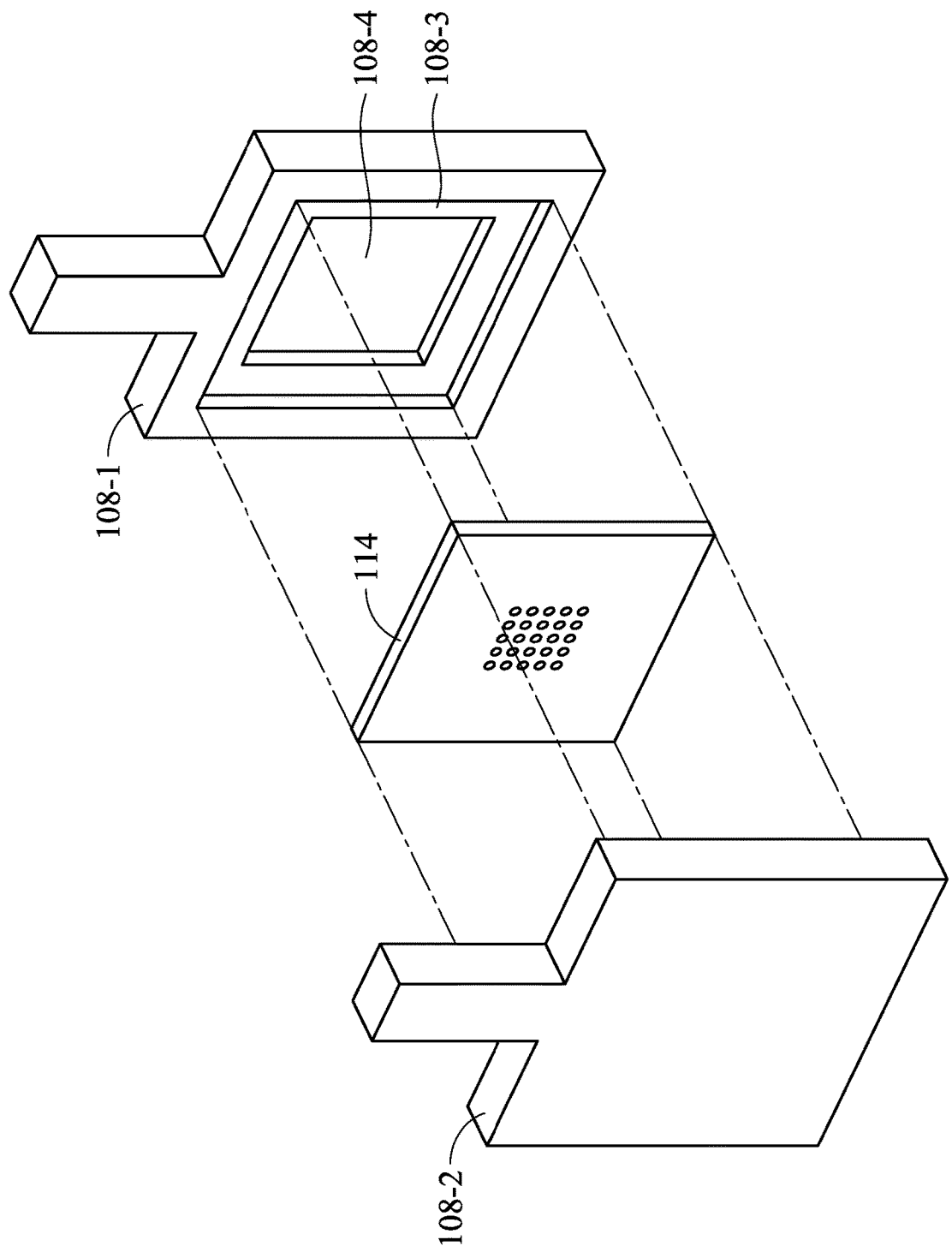
FIG. 3 illustrates a jig and a substrate, in accordance with some embodiments of the present disclosure.

FIG. 3 illustrates a jig and a substrate, in accordance with some embodiments of the present disclosure. The jig 108 can be separated into a first component 108-1 and a second component 108-2 (separated along the dashed line of the jig 108 in FIG. 1). There is a space in the first component 108-1 and the second component 108-2 to accommodate the substrate 114. The first component 108-1 and the second component 108-2 each have a clamping region 108-3 that faces and clamps the substrate 114 to perform the electrochemical process subsequently. The first component 108-1 further has an opening region 108-4 to expose a portion of the substrate 114. The exposed portion (region) of the substrate is a region where the redox reaction occurs during electrochemical process to electroplate metal or electrolytically etch the metal. In some embodiments, the exposed portion of the substrate 114 is referred to as a processing region, and the portion of the substrate clamped by the clamping region 108-3 (i.e., the portion (region) where the substrate is not exposed) is referred to as a non-processing region. The clamping region 108-3 of the first component 108-1 (facing to the substrate 114) further includes a plurality of processing electrodes and a plurality of measuring electrodes (not shown). When the jig 108 clamps the substrate 114, the processing electrodes and the measuring electrodes may contact the metal layer on the substrate 114, so that the electrochemical process device 100 can perform the electrochemical process on the substrate 114 through the processing electrodes, and can measure the thickness of the metal layer of the substrate 114 through the measuring electrodes. Specifically, as discussed above, The processing electrodes are connected to the current supply unit 106 and contact the metal layer on the substrate 114, so that the current supply unit 106 can provide the current to the metal layer of the substrate 114 to perform the electrochemical process, the measuring electrodes are connected to the controller 112 and contact the metal layer on the substrate 114, so that the controller 112 can measure the thickness of the metal layer of the substrate 114.

In some embodiments, the second component 108-2 has the same structure as the first component 108-1 for performing the electrochemical process on the other side of the substrate 114. Specifically, the second component 108-2 also includes an opening region, a plurality of processing electrodes, and a plurality of measuring electrodes, so that a portion of other side of the substrate 114 (i.e., the side of the substrate 114 facing the second component 108-2 in FIG. 3) is exposed. With this jig 108 composed of the first component 108-1 and the second component 108-2 having the same structure, the electrochemical processing device 100 can simultaneously perform the electrochemical process on both sides of the substrate 114 and respectively measure the thickness of the metal layers on both sides of the substrate 114.

FIGS. 4A and 4B illustrate a portion of a jig, in accordance with some embodiments of the present disclosure. As discussed above, the clamping region 108-3 of the first component 108-1 of the jig 108 includes a plurality of processing electrodes and a plurality of measuring electrodes. In FIG. 4A, the first component 108-1 includes a clamping region 108-3, an opening region 108-4, and O-rings 108-5 and 108-6 for water blocking, and the clamping region 108-3 includes four processing electrodes 108-7 and four measuring electrodes A, B, C and D. When the electrochemical process is performed, the O-rings 108-5 and 108-6 can prevent the electrolyte solution from intruding into the clamping region 108-3 to affect the processing electrodes 108-7 and the measuring electrodes A, B, C, and D.

It should be understood that the shapes and sizes of the four processing electrodes 108-7 and the four measuring electrodes A, B, C, and D in FIG. 4A are exemplary, and are not intended to limit the present disclosure. In some embodiments, the size of the processing electrodes 108-7 is larger than the size of the measuring electrodes A, B, C, and D, so that the electrochemical process using the large current, may be performed well through the process electrode 108-7, and the electrochemical process is not easily affected when the thickness of the metal layer is measured through the measuring electrodes A, B, C, and D.

In order to facilitate the electrochemical process, the processing electrodes of the jig is disposed at a symmetrical position in the clamping region, so that the electrochemical processing device can uniformly electroplate (or electrolytically etch) the metal layer. For example, as shown in FIG. 4A, four processing electrodes 108-7 are symmetrically disposed in the clamping region 108-3.

Furthermore, in order for the electrochemical processing device to accurately measure the thickness of the metal layer, the shape substantially defined by the measuring electrodes may be rectangular, and its center of gravity overlaps or approaches the center of gravity of the opening region. For example, as shown in FIG. 4A, the four measuring electrodes A, B, C, and D are asymmetrically disposed in the clamping region 108-3, but the four measuring electrodes A, B, C, and D may define a rectangle (as shown by the dashed line) and the center of gravity of this rectangle overlaps or be close the center of gravity of the opening area 108-4. In this rectangle, a line segment between the measuring electrodes A and B is in parallel with and equal to a line segment between the measuring electrodes C and D, and a line segment between the measuring electrodes A and C is in parallel with and equal to a line segment between the measuring electrodes B and D. More specifically, when the jig 108 clamps the substrate 114 to perform the electrochemical process, the center of gravity of the shape defined by the measuring electrodes A, B, C, and D may overlap or be close to the center of gravity of the processing region of the substrate (a portion of the substrate 114 exposed in the opening region 108-4 is the processing region), such that electrochemical processing device 100 can accurately measure the thickness of the metal layer of the substrate 114. In some embodiments, as shown in FIG. 4B, the first component 108-1 of the jig 108 has only two measuring electrodes A and B. In this embodiment, the measuring electrodes A and B may be wired to define a line segment (as shown by the dashed line), and the line segment passes through or is close to the center of gravity of the opening region 108-4, so that the electrochemical processing device 100 may accurately measure the thickness of the metal layer of the substrate 114.

If the shape substantially defined by the measuring electrodes is not rectangular, additional corrections may be required when measuring the thickness of the metal layer. This increases the complexity of the measurement and possibly reduces the accuracy of the measurement.

Figure 4:
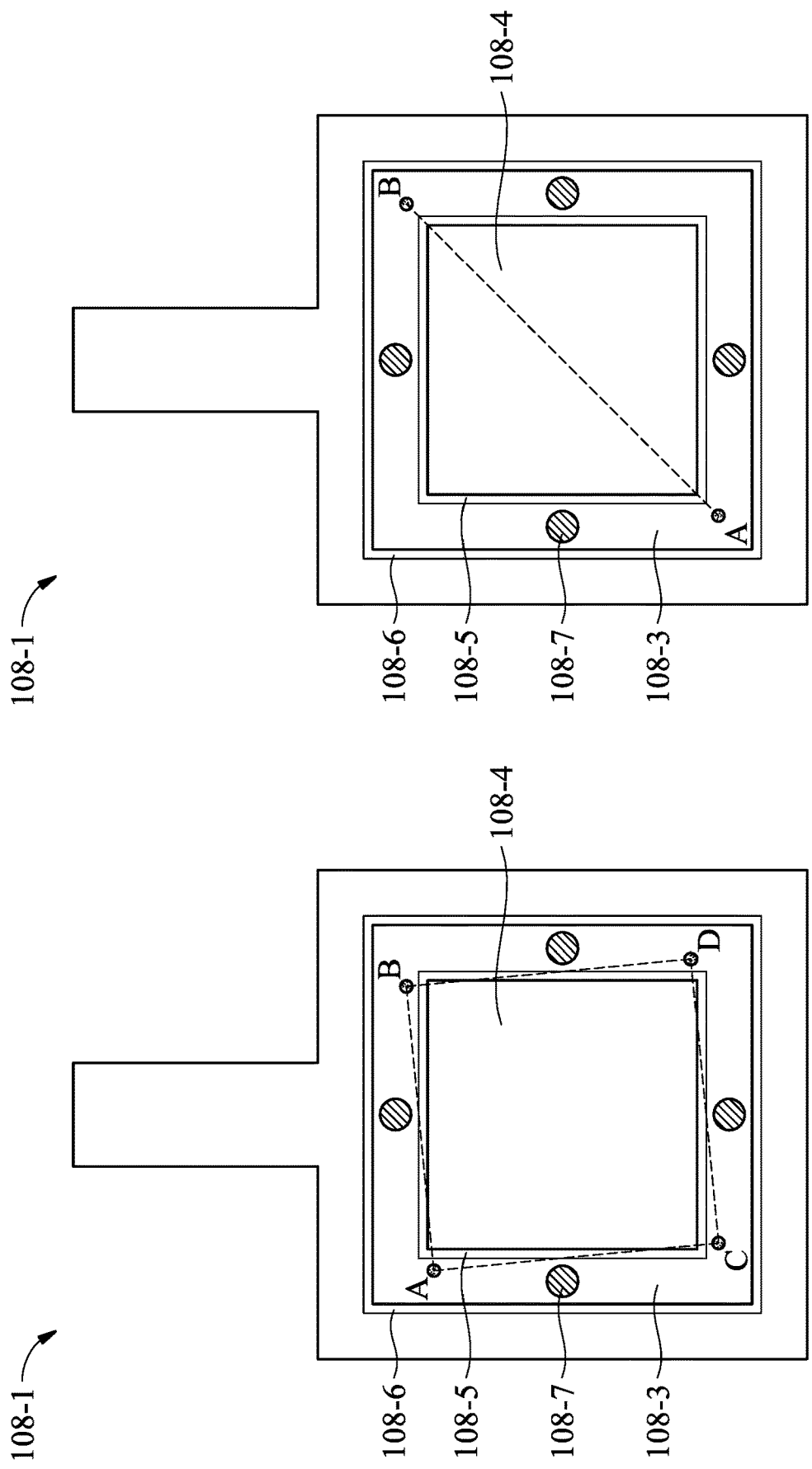
FIGS. 4A and 4B illustrate a portion of a jig, in accordance with some embodiments of the present disclosure.

In some embodiments, as shown in FIGS. 3 to 4B, the space in the jig 108 for accommodating the substrate is a square. In other embodiments, the space in which the substrate is accommodated may be circular, rectangular, triangular, other polygonal or irregular.

The following describes a method for the controller 112 to measure the thickness of the metal layer of the substrate when the electrochemical processing device 100 performs the electrochemical process.

In the present embodiment, after the controller 112 measures the sheet resistance $R_S$ of the metal layer of the substrate 114 through the measuring electrodes, the controller 112 can calculate the thickness of the metal layer by using the resistivity ρ of the known metal layer and the sheet resistance $R_S$. The formula is as follows:

$$T = \frac{\rho}{R_s}$$

In the above formula, T is the thickness of the metal layer; ρ is the resistivity of the metal layer; and $R_S$ is the sheet resistance of the metal layer.

In order to more accurately measure the thickness of the metal layer, in some embodiments, the sheet resistance of the metal layer is measured using the Van der Pauw method. Referring to FIG. 4A, the controller 112 first obtains four resistances $R_1$, $R_2$, $R_3$, and $R_4$ through the measuring electrodes A, B, C, and D, as shown in the following table:

| measuring electrode A | measuring electrode B | measuring electrode C | measuring electrode D | resistance |
|---|---|---|---|---|
| I | I | V | V | $R_1 = V_{CD}/I_{AB}$ |
| V | V | I | I | $R_2 = V_{AB}/I_{CD}$ |
| I | V | I | V | $R_3 = V_{BD}/I_{AC}$ |
| V | I | V | I | $R_4 = V_{AC}/I_{BD}$ |

As shown in the table, the controller 112 provides the measuring current to the measurement electrodes A and B ($I_{AB}$), and measures the voltage $V_{CD}$ between the measuring electrodes C and D, thereby obtaining a resistance $R_1$; the controller 112 provides the measuring current to the measurement electrodes C and D ($I_{CD}$), and measures the voltage $V_{AB}$ between the measuring electrodes A and B, thereby obtaining a resistance $R_2$; the controller 112 provides the measuring current to the measurement electrodes A and C ($I_{AC}$), and measures the voltage $V_{BA}$ between the measuring electrodes B and D, thereby obtaining a resistance $R_3$; the controller 112 provides the measuring current to the measurement electrodes B and D ($I_{BD}$), and measures the voltage $V_{AC}$ between the measuring electrodes A and C, thereby obtaining a resistance $R_4$. In the present embodiment, as discussed above, the measuring current is alternating current to prevent the measuring current from affecting the electrochemical process. Specifically, since the measuring current is alternating current, the electroplating or electrolysis caused by the measuring current can cancel each other out without affecting the metal layer of the substrate.

After obtaining four resistances $R_1$, $R_2$, $R_3$, and $R_4$, the resistances $R_1$ and $R_2$ are added and divided by two to obtain a resistance $R_H$ ($R_H=(R_1+R_2)/2$); the resistances $R_3$ and $R_4$ are added and divided by two to obtain a resistance $R_V$ ($R_V=(R_3+R_4)/2$). Finally, by using the Van der Pauw formula, the sheet resistance of the metal layer can be obtained. The Van der Pauw formula is as follows:

$$e^{-\pi \frac{R_V}{R_S}} + e^{-\pi \frac{R_H}{R_S}} = 1$$

wherein $R_S$ is the sheet resistance of the metal layer.

As the above formula, after the resistances $R_H$ and $R_V$ are substituted into the Van der Pauw formula, the sheet resistance $R_S$ of the metal layer can be calculated. Next, as discussed above, the thickness of the metal layer can be calculated by using the resistivity of the known metal layer and the sheet resistance $R_S$. Therefore, as discussed above, when the electrochemical processing device 100 performs the electrochemical process, the controller 112 can measure the thickness of the metal layer of the substrate on-line.

In the present embodiment, as discussed above, the measuring current is alternating current to prevent the measuring current from affecting the electrochemical process. In some embodiments, the measuring current is alternating current having a frequency of 60 Hz. In other embodiments, the measuring current is an alternating current having a frequency below 1 kHz. In some embodiments, the measuring current is an alternating current of 25 mA to 100 mA.

Furthermore, in the present embodiment, in order to accurately measure the thickness of the metal layer, the controller 112 takes one second to measure one data (such as the resistances $R_1$, $R_2$, $R_3$ or $R_4$ discussed above). Specifically, when the controller 112 measures data, the controller 112 does not measure the data immediately, but passes a predetermined time (e.g., one second), so that the measuring current applied to the measuring electrode is stabilized, and then the data is measured. For example, when the controller 112 provides the measuring current to the measuring electrodes A and B ($I_{AB}$) and measures the voltages between the measuring electrodes C and D ($V_{CD}$) to obtain the resistance $R_1$, the resistance $R_1$ is a stable result measured by the controller 112 for one second. Therefore, each time the controller 112 completely measures the thickness of the metal layer of the substrate once, it takes about 4 to 5 seconds.

When the controller 112 measures the thickness of the metal layer of the substrate, since the electrolyte solution 104 is electrically conductive, the measurement result will also be affected. Thus, in some embodiments, the effect of the electrolyte 104 can be considered to obtain a more accurate thickness of the metal layer. Specifically, when the electrochemical process is performed, the sheet resistance of the metal layer measured by the controller 112 is affected by the electrolyte solution 104. Therefore, the sheet resistance of the initial metal layer immersed in the electrolyte solution 104 is measured before performing the electrochemical process. Then, through the sheet resistance of the initial metal layer and the sheet resistance of the metal layer during the electrochemical process, the sheet resistance of the metal layer increased (or reduced) by the electrochemical process can be calculated. There is no factor of the affection of the electrolyte solution 104 in this sheet resistance. Therefore, the actual thickness of the metal layer can be calculated.

Before the electroplating process is performed, the thickness of the initial metal layer (seed layer) of the substrate is first measured as $T_{ini}$, and when the substrate is in the electrolyte solution 104, the sheet resistance of the initial metal layer is $R_{ini}$ (the electroplating process has not been performed). As discussed above, when the electroplating process is performed, the sheet resistance $R_{tot}$ of the metal layer can be measured. Then, through the following calculations:

$$\frac{1}{R_{tot}} = \frac{1}{R_{ini}} + \frac{1}{R_\Delta}$$

The sheet resistance $R_A$ of the electroplated metal layer (i.e., the metal layer increased during the electroplating process) can be obtained. With the known resistivity ρ of the metal layer and this sheet resistance $R_A$, the thickness $T_A$ of the increased metal layer can be calculated. Finally, by adding $T_A$ to $T_{ini}$, the thickness $T_{tot}$ of the entire metal layer on the substrate during the electroplating process can be obtained.

In contrast, before the electrolytic etching process is performed, the thickness of the initial metal layer of the substrate is first measured as $T_{ini}$, and when the substrate is in the electrolyte solution 104, the sheet resistance of the initial metal layer is $R_{ini}$ (the electrolytic etching process has not been performed). As discussed above, when the electrolytic etching process is performed, the sheet resistance $R_{tot}$ of the metal layer can be measured. Then, through the following calculations:

$$\frac{1}{R_{ini}} = \frac{1}{R_{tot}} + \frac{1}{R_\Delta}$$

The sheet resistance $R_A$ of the etched metal layer (i.e., the metal layer reduced during the electrolytic etching process) can be obtained. With the known resistivity ρ of the metal layer and this sheet resistance $R_A$, the thickness $T_A$ of the reduced metal layer can be calculated. Finally, by subtracting $T_A$ from $T_{ini}$, the thickness $T_{tot}$ of the entire metal layer on the substrate during the electrolytic etching process can be obtained.

The following table is an example of the sheet resistance of the metal layer of the substrate measured by the controller 112 when the electrochemical processing device 100 performs the electroplating process.

| | Before electroplating process | | During electroplating process | | |
|---|---|---|---|---|---|
| | $R_{ini}$ (Ω/sq.) | $T_{ini}$ (μm) | $R_{tot}$ (Ω/sq.) | $R_\Delta$ (Ω/sq.) | $T_\Delta$ (μm) |
| Example 1 | 0.287 | 0.4 | 0.0171 | 0.0182 | 2.14 |
| Example 2 | 0.275 | 0.4 | 0.0096 | 0.0099 | 3.94 |

The electroplated metal has a resistivity of 3.9 μΩ·cm.

In Example 1, the thickness ($T_{ini}$) of the initial metal layer (seed layer) of the substrate was 0.4 μm, and the sheet resistance ($R_{ini}$) of the initial metal layer in the electrolyte solution 104 was 0.287 Ω/sq. When performing the electroplating process, the controller measures that the sheet resistance ($R_{tot}$) of the metal layer is 0.0171 Ω/sq. Then, based on the $R_{ini}$ and $R_{tot}$, the controller can calculate that the sheet resistance $R_A$ of the electroplated metal layer (i.e., the metal layer increased during the electroplating process) is 0.0182 Ω/sq. By dividing the resistivity 3.9 μΩ·cm of the metal by $R_A$, the thickness ($T_A$) of the metal layer increased during the electroplating process is 2.14 μm. Finally, the thickness of the actual metal layer during the electroplating process is 2.54 μm by adding $T_A$ to $T_{ini}$.

In Example 2, the thickness ($T_{ini}$) of the initial metal layer (seed layer) of the substrate was 0.4 μm, and the sheet resistance ($R_{ini}$) of the initial metal layer in the electrolyte solution 104 was 0.275 Ω/sq. When performing the electroplating process, the controller measures that the sheet resistance ($R_{tot}$) of the metal layer is 0.0096 Ω/sq. Then, based on the $R_{ini}$ and $R_{tot}$, the controller can calculate that the sheet resistance $R_A$ of the electroplated metal layer (i.e., the metal layer increased during the electroplating process) is 0.0099 Ω/sq. By dividing the resistivity 3.9 μΩ·cm of the metal by $R_A$, the thickness ($T_A$) of the metal layer increased during the electroplating process is 3.94 μm. Finally, the thickness of the actual metal layer during the electroplating process is 4.34 μm by adding $T_A$ to $T_{ini}$.

Figure 5:
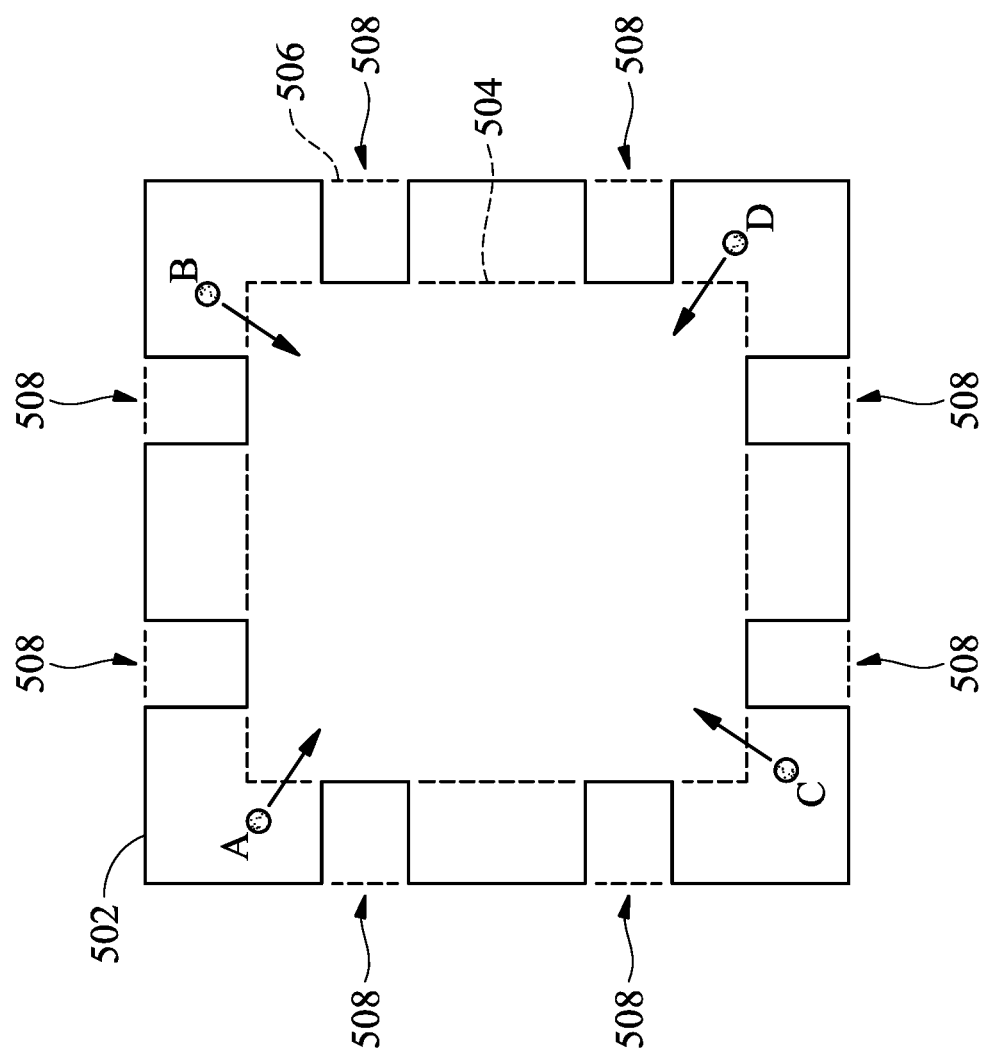
FIG. 5 illustrates a substrate having a special design, in accordance with some embodiments of the present disclosure.

In some embodiments, in order to increase the accuracy of the measurement, the substrate 114 may have a special design such that when the jig 108 clamps the substrate 114 to perform the electrochemical process, the measuring electrodes (and processing electrodes) in the clamping region 108-3 are separated from one another. For example, as shown in FIG. 5, the substrate 502 has a special design. The substrate 502 has eight space regions 508 disposed in a region of the substrate that is clamped by the clamping region of the jig (i.e., the non-processing region). When the substrate 502 is clamped by the jig, the space regions 508 separate the measuring electrodes A, B, C, and D from each other in the clamping region (the region between the dashed lines 504 and 506). This means that when the current (i.e., the measuring current) is provided to the measuring electrodes A, B, C, and D for measurement, the current does not flow from one measuring electrode to another through the non-processing region of the substrate 502 clamped by the clamping region. The current flows directly to the processing region (the area within the dashed line 504) (the current subsequently flows to the other measuring electrode), as the arrows shown in FIG. 5. Therefore, the influence of the measuring electrodes A, B, C, and D (and the processing electrode) on each other can be reduced, thereby reducing the error of the measurement. In other embodiments, the space regions 508 are disposed in the metal layer of the substrate 502, that is, FIG. 5 represents the metal layer of the substrate 502, rather than the shape of the entire substrate 502.

Figure 6:
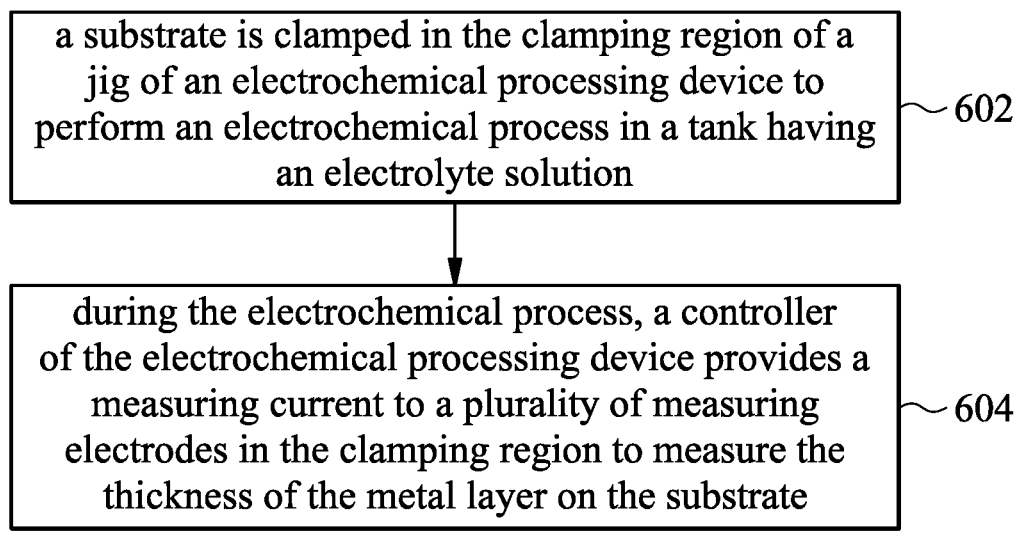
FIG. 6 is a flow chart of a method for operating an electrochemical processing device, in accordance with some embodiments of the present disclosure.

FIG. 6 is a flow chart of a method for operating an electrochemical processing device, in accordance with some embodiments of the present disclosure. The method 600 includes operation 602 and operation 604. In operation 602, a substrate is clamped in the clamping region of a jig of an electrochemical processing device to perform an electrochemical process in a tank having an electrolyte solution. In operation 604, during the electrochemical process, a controller of the electrochemical processing device provides a measuring current to a plurality of measuring electrodes in the clamping region to measure the thickness of the metal layer on the substrate.

Figure 7:
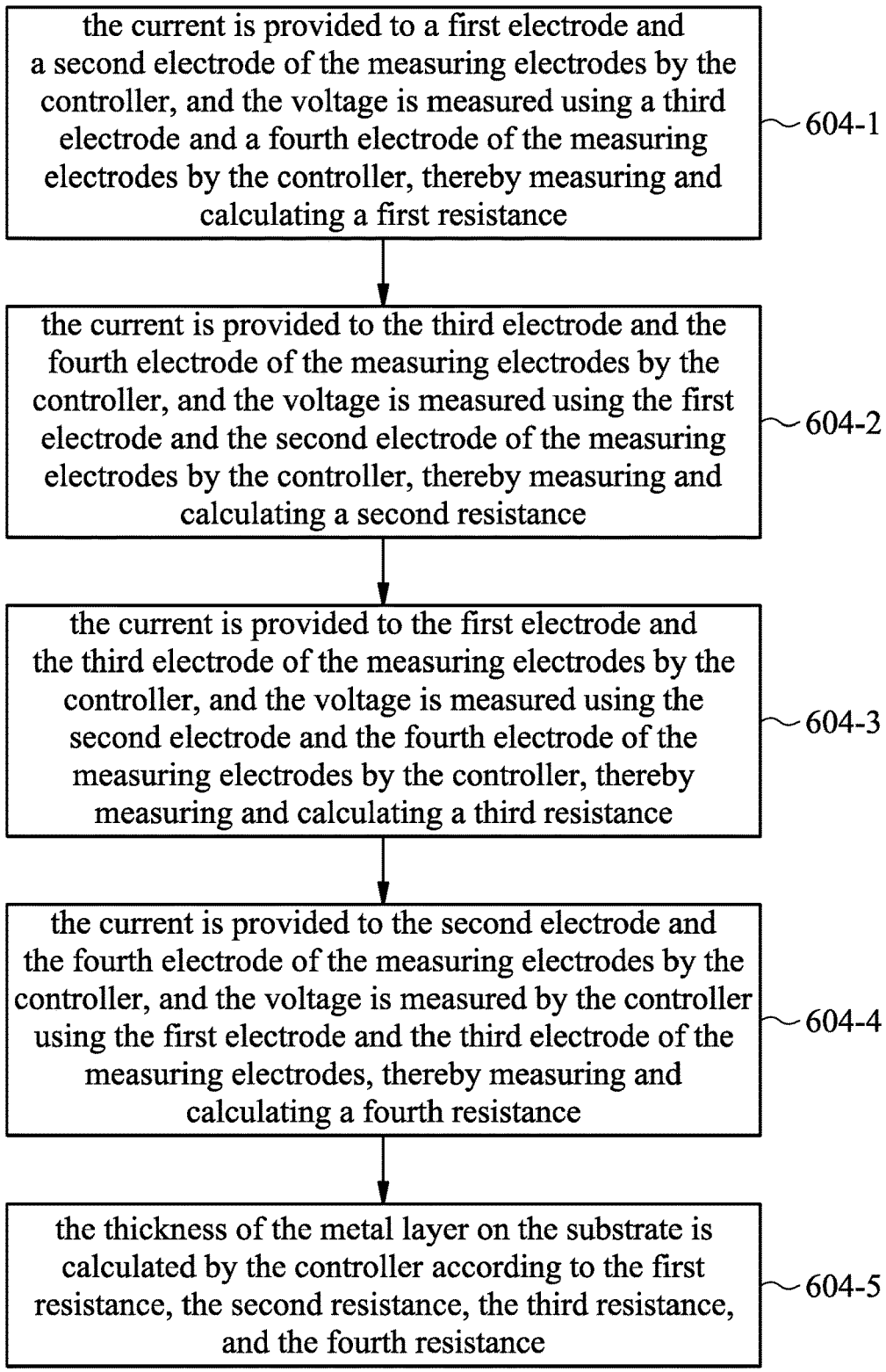
FIG. 7 is a flow chart of a controller of the electrochemical processing device measures the thickness of the metal layer on the substrate during the electrochemical process, in accordance with some embodiments of the present disclosure.

In some embodiments, as shown in FIG. 7, operation 604 further includes operations 604-1, 604-2, 604-3, 604-4, and 604-5. In operation 604-1, the current (i.e., the measuring current) is provided to a first electrode and a second electrode of the measuring electrodes by the controller, and the voltage is measured using a third electrode and a fourth electrode of the measuring electrodes by the controller, thereby measuring and calculating a first resistance. For example, as discussed above with reference to FIG. 4A, the controller 112 provides a measuring current to the measuring electrodes A and B ($I_{AB}$), and measures the voltages between the measurement electrodes C and D ($V_{CD}$) to obtain a resistance $R_1$.

In operation 604-2, the current is provided to the third electrode and the fourth electrode of the measuring electrodes by the controller, and the voltage is measured using the first electrode and the second electrode of the measuring electrodes by the controller, thereby measuring and calculating a second resistance. For example, as discussed above with reference to FIG. 4A, the controller 112 provides the measuring current to the measuring electrodes C and D ($I_{CD}$), and measures the voltages between the measurement electrodes A and B ($V_{AB}$) to obtain a resistance $R_2$.

In operation 604-3, the current is provided to the first electrode and the third electrode of the measuring electrodes by the controller, and the voltage is measured using the second electrode and the fourth electrode of the measuring electrodes by the controller, thereby measuring and calculating a third resistance. For example, as discussed above with reference to FIG. 4A, the controller 112 provides the measuring current to the measuring electrodes A and C ($I_{AC}$), and measures the voltages between the measurement electrodes B and D ($V_{BD}$) to obtain a resistance $R_3$.

In operation 604-4, the current is provided to the second electrode and the fourth electrode of the measuring electrodes by the controller, and the voltage is measured by the controller using the first electrode and the third electrode of the measuring electrodes, thereby measuring and calculating a fourth resistance. For example, as discussed above with reference to FIG. 4A, the controller 112 provides the measuring current to the measuring electrodes B and D ($I_{BD}$), and measures the voltages between the measurement electrodes A and C ($V_{AC}$) to obtain a resistance $R_4$.

In operation 604-5, the thickness of the metal layer on the substrate is calculated by the controller according to the first resistance, the second resistance, the third resistance, and the fourth resistance. For example, as discussed above, the thickness of the metal layer on the substrate can be calculated by the controller using four resistances $R_1$, $R_2$, $R_3$, and $R_4$, Van der Pauw formula, and a resistivity of the metal layer.

In the semiconductor process, if the substrate is a flexible substrate or an ultra-thin glass, and when performing a planarization process on the metal layer of the substrate, in order to prevent the substrate from being deflected and broken, an electrolytic etching process is used for polishing instead of using chemical mechanical polishing (CMP) for polishing. In this case, an etching stop layer is normally formed on the substrate to determine whether the electrolytic etching process has been completed. However, the formation of the etching stop layer increases the complexity and cost of the semiconductor process.

By utilizing the embodiments of the present disclosure, when an electrochemical process (e.g., an electrolytic etching process) is performed on the metal layer of the substrate, the thickness of the metal layer can be measured on-line. Therefore, it can be determined whether the electrochemical process has been completed.

Furthermore, non-contact optical or electromagnetic wave measurement is generally used when performing double-side metal layer measurement on a substrate. However, such non-contact measurements cannot accurately determine the respective thicknesses of the metal layers on both sides of the substrate. In the present embodiment, the measuring electrodes can be used to respectively measure the metal layers on both sides of the substrate. Therefore, the respective thicknesses of the metal layers on both sides of the substrate can be accurately determined.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art, and will not be interpreted in an idealized or overly formal sense unless expressly so defined herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrochemical processing device, comprising:
   a current supply unit, used to provide a current for performing an electrochemical process;
   a jig, comprising:
      a clamping region, used to clamp a substrate;
      a plurality of processing electrodes, disposed in the clamping region, the plurality of processing electrodes being connected to the current supply unit; and
      a plurality of measuring electrodes, disposed in the clamping region; and
   a controller, connected to the plurality of measuring electrodes when the jig clamps the substrate to perform the electrochemical process, the controller providing a measuring current to the plurality of measuring electrodes to measure the thickness of a metal layer of the substrate.

2. The electrochemical processing device as claimed in claim 1, wherein the substrate has a plurality of space regions, disposed in a region where the substrate is clamped by the clamping region.

3. The electrochemical processing device as claimed in claim 1, wherein the measuring current provided by the controller is an alternating current.

4. The electrochemical processing device as claimed in claim 3, wherein the number of the plurality of measuring electrodes is two, and when the jig clamps the substrate, a line segment of the two measuring electrodes passes through the center of gravity of the substrate.

5. The electrochemical processing device as claimed in claim 3, wherein the number of the plurality of measuring electrodes is four and the four measuring electrodes define a rectangle, and wherein a line segment between a first electrode and a second electrode of the four measuring electrode is in parallel with and equal to a line segment between a third electrode and a fourth electrode of the four measuring electrodes and a line segment between the first electrode and the third electrode is in parallel with and equal to a line segment between the second electrode and the fourth electrode.

6. The electrochemical processing device as claimed in claim 5, wherein when the jig clamps the substrate to perform the electrochemical process,
- the controller provides the measuring current to the first electrode and the second electrode, and measures the voltage between the third electrode and the fourth electrode, thereby measuring and calculating a first resistance;
- the controller provides the measuring current to the third electrode and the fourth electrode, and measures the voltage between the first electrode and the second electrode, thereby measuring and calculating a second resistance;
- the controller provides the measuring current to the first electrode and the third electrode, and measures the voltage between the second electrode and the fourth electrode, thereby measuring and calculating a third resistance;
- the controller provides the measuring current to the second electrode and the fourth electrode, and measures the voltage between the first electrode and the third electrode, thereby measuring and calculating a fourth resistance; and
- the controller calculates the thickness of the metal layer of the substrate according to the first resistance, the second resistance, the third resistance, and the fourth resistance.

7. A method for operating an electrochemical processing device, comprising:
- clamping a substrate in a clamping region of a jig to perform an electrochemical process; and
- providing a measuring current to a plurality of measuring electrodes in the clamping region by a controller to measure the thickness of the metal layer of the substrate when performing the electrochemical process.

8. The method as claimed in claim 7, wherein the measuring current provided by the controller is an alternating current.

9. The method as claimed in claim 7, wherein the number of the plurality of measuring electrodes is two and when the jig clamps the substrate, a line segment of the two measuring electrodes passes through the center of gravity of the substrate.

10. The method as claimed in claim 7, wherein the number of the plurality of measuring electrodes is four and the four measuring electrodes define a rectangle, and wherein a line segment between a first electrode and a second electrode of the four measuring electrodes is in parallel with and equal to a line segment between a third electrode and a fourth electrode of the four measuring electrodes, and a line segment between the first electrode and the third electrode is in parallel with and equal to a line segment between the second electrode and the fourth electrode.

11. The method as claimed in claim 10, wherein the step of performing the electrochemical process comprises:
- providing the measuring current to the first electrode and the second electrode, and measuring the voltage between the third electrode and the fourth electrode, thereby measuring and calculating a first resistance;
- providing the measuring current to the third electrode and the fourth electrode, and measuring the voltage between the first electrode and the second electrode, thereby measuring and calculating a second resistance;
- providing the measuring current to the first electrode and the third electrode, and measuring the voltage between the second electrode and the fourth electrode, thereby measuring and calculating a third resistance;
- providing the measuring current to the second electrode and the fourth electrode, and measuring the voltage between the first electrode and the third electrode, thereby measuring and calculating a fourth resistance; and
- calculating the thickness of the metal layer of the substrate by the controller according to the first resistance, the second resistance, the third resistance, and the fourth resistance.

* * * * *